United States Patent
Camilleri et al.

(10) Patent No.: US 6,661,820 B1
(45) Date of Patent: Dec. 9, 2003

(54) METHOD AND SYSTEM FOR MAXIMIZING SAFE LASER POWER OF STRUCTURED LASER LIGHT PROJECTORS USED WITH IMAGING SENSORS

(75) Inventors: Joseph Camilleri, Brighton, MI (US); David L. Kelly, Ypsilanti, MI (US); Mark R. Warren, Commerce Township, MI (US)

(73) Assignee: Perceptron, Inc., Plymouth, MI (US)

(*) Notice: Subject to any disclaimer, the term of this patent is extended or adjusted under 35 U.S.C. 154(b) by 259 days.

(21) Appl. No.: 09/635,388

(22) Filed: Aug. 9, 2000

Related U.S. Application Data
(60) Provisional application No. 60/147,913, filed on Aug. 9, 1999.

(51) Int. Cl.[7] .................................................. H01S 3/00
(52) U.S. Cl. ................................. 372/38.09; 372/38.07
(58) Field of Search ....................... 372/38.07, 25, 372/30, 10, 29.015, 38.09

(56) References Cited

U.S. PATENT DOCUMENTS

| | | | | |
|---|---|---|---|---|
| 5,092,865 A | * | 3/1992 | Rink | 606/12 |
| 5,128,601 A | * | 7/1992 | Orbach et al. | 372/30 |
| 5,793,476 A | * | 8/1998 | Laakmann et al. | 356/28 |
| 5,793,477 A | * | 8/1998 | Laakmann | 356/28 |
| 6,091,749 A | * | 7/2000 | Hoffmaster et al. | 372/38.02 |
| 6,091,750 A | * | 7/2000 | Paschal et al. | 372/38 |
| 6,185,233 B1 | * | 2/2001 | Moothart et al. | 372/32 |
| 6,188,704 B1 | * | 2/2001 | Kwon et al. | 372/25 |
| 6,285,692 B1 | * | 9/2001 | Okayasu | 372/38.02 |

OTHER PUBLICATIONS

Opto Power Corporation Online; High–Power Microprocessor–Controlled Units; http://www.optopower.com/opc/h01d030.htm; Dec. 2, 1999.

200 MHz Laser Diode Drive with Light Power Control; Analog Devices, Inc., 1995; pp. 1–12.

Avtech Electrosystems Ltd.; Featured Product: The AV–155 Series; wysiwyg://18/http://www.avtechpulse.com/feature3/; Jan. 18, 2000.

DEI; Laser Diode Drivers; http://www.directedenergy.com/Products/laser.htm; Jan. 18, 2000.

(List continued on next page.)

*Primary Examiner*—Paul Ip
*Assistant Examiner*—Phillip Nguyen
(74) *Attorney, Agent, or Firm*—Harness, Dickey & Pierce, P.L.C.

(57) ABSTRACT

A system and method for controlling the operating parameters of a laser diode (20) is provided. The laser control system (10) automatically optimizes the laser diode (20) operating characteristics while maintaining a safe peak power for pulse duration and pulse repetition frequency (PRF). The controlled level of output power is based on the laser diode gain determined during calibration of each laser diode projector as well as using the application of predetermined laser safety formulas. The laser control system (10) includes a laser diode (20) that is powered by a laser drive current. The laser diode (20) has a laser output having a peak power level. A detector (28) is coupled to the laser diode (20) for sensing the laser output. A laser driver (18) including a primary control loop (44) is operable, in response to the sensed laser output and a reference (43), to control the laser drive current such that the output power corresponds to the reference (43). A controller (52) is coupled to the laser driver (18). The controller (52) includes a laser settings module (40) for generating the reference (43) in response to a laser output setting (42) such that the laser output characteristic level is approximately a predetermined output level. The output characteristic of the laser diode (20) is maintained within the predetermined standard. Another aspect of the invention provides an independent safety monitoring function (68) based on the laser settings.

24 Claims, 5 Drawing Sheets

OTHER PUBLICATIONS

μLS; DB Series OEM Diode Laser Drivers; http://www.microlaser.com/dbseries.html; Jan. 18, 2000.

hytek Microsystems; High–Speed Laser Diode Driver HY–6110; Dec. 1997.

r*p*m*c; PPS–3000 Laser Diode Driver/Controller; http://www.iwc.com/rpmc/Laser%2520Diode%2520Driver.htm; Jan. 18, 2000.

Miniature Laser Driver Board; http://www.bwtec.com/bwd800.html; Jan. 18, 2000.

E–O Devices; EXT–2 MOSFET–based Pulsed Laser Diode Driver.

tis; Quantam leap in optical control engineering The tis Sensor; version 1.1.

sami; SmartProx ™ Sensors For In–Process Monitoring.

STiL; CHR 150 High Resolution Optical Gauge.

Wintriss Engineering Corporation; OPSIS 5000L Vision System.

Robert N. Johnson; Building Plug–and–Play Networked Smart Transducers; SENSORS, Oct., 1997; pp. 40–61.

Integrated Electronic Technologies; http://zeus.odyssey.net/cmossensors/success.htm; Dec. 20, 1996.

J. Zarnowski, M. Pace, and M. Joyner; 1.5 FET Per Pixel Standard CMOS Active Column Sensor; Preliminary Paper For SPIE West show; Dec. 30, 1998.

Jeffrey Zarnowski and Matt Pace; Imaging options expand with CMOS technology; Laser Focus World; Jun., 1997; pp. 125–130.

Insight; Integrated CMOS Color System Imager Chip; http://www.aTmel.com.

Junko Yoshida; G–Link imager points to industrial camera arena.

Photobit; Company Overview; pp. 1–8.

CIDTEC; Random Access Charge Injection Device Imaging Sensors; RACID810/811.

Frank Goodenough; Get Ready For TV Cameras On A Chip; Electronic Design; Feb. 19, 1996.

Chappel Brown; All–CMOS imaging challenges CCDs; Jan. 2, 1996, Issue 882, Section: Technology.

Business Vision; Vision Systems Design; Feb., 1998; p. 19.

Charles Whipple; Toshiba Turns to CMOS for Image Sensors; Photonics Spectra; May, 1997; p. 40.

IMPUTER 3; Overview; Vision.

New Low–Cost Sensor Makes Possible One–Chip High–Performance Digital Cameras; http://www.sarnoff.com/press%20releases/cmos12_97htm.htm; Dec. 22, 1997.

Product Applications; http://www.photobit.com/produx.htm; Mar. 4, 1997.

Photobit; PB–159DX Camera On A Chip; Mar. 31, 1997; pp. 1–31.

OmniVision; CMOS Color/BW Digital Video Image IC; Version 1.1; Sep. 2, 1998.

* cited by examiner

| Laser Driver | Ref Value | | Slope | Y Intercept | Scaling Factor |
|---|---|---|---|---|---|
| | Nominal Power | 1/2 Nominal Power | | | |
| 1 2 . . . N | | | | | |

# METHOD AND SYSTEM FOR MAXIMIZING SAFE LASER POWER OF STRUCTURED LASER LIGHT PROJECTORS USED WITH IMAGING SENSORS

CROSS-REFERENCE TO RELATED APPLICATIONS

This application claims the benefit of the filing date of U.S. provisional application No. 60/147,913 filed Aug. 9, 1999.

BACKGROUND AND SUMMARY OF THE INVENTION

The present invention relates generally to the output power control of eye safe structured laser light. Such structured laser light is used to illuminate features which are then imaged with a one-dimensional or two-dimensional imaging array (camera). In particular, the present invention takes advantage of laser safety standards which allow for greater peak power levels for pulsed lasers. Particularly, in applications requiring high speed "stop action" imaging the present invention will, transparent to the user, facilitate optimization for best signal level at selected integration times.

Traditionally, for any commercial laser projector systems, laser output power is set at a single fixed "safe" power level during manufacture of the laser projection device. The laser power setting for commercial laser products is established per applicable U.S. and international safety standards. For example, CDRH 21 CFR Part 1040.10 requires that commercial CW laser systems rated at Class II emit no more than 1 milliwatt of visible laser power into a 7 millimeter aperture at a specified distance from the laser source. For pulsed laser systems, the same 1 mW power level rating is in effect, but the power level is now considered average rather than continuous power. Average power for a pulsed laser is computed as the peak pulse power multiplied by the duty cycle (percentage of on-time of the pulse) of the pulse train.

For pulsed laser systems, international laser safety standards also allow for greater peak pulse power levels as long as the 1 mW average power setting is not violated. A formula for visible laser radiation and appropriate to the intended use of the laser establishes the maximum allowable peak power. In particular, EN 60825-1 standard for Class 3A rated laser systems requires that the following formula for visible light with pulse duration greater than 1.8 microseconds be used to establish the maximum peak power level using the 7 mm aperture:

$$Pp = \frac{0.7}{(N*t_p)^{0.25}}$$

where: $Pp$ = peak pulse power in mW $N$ = number of pulses in 0.25 second interval $t_p$ = pulse duration of an individual pulse in seconds In this case, depending on the pulse duration and pulse duty cycle, it is possible to have a peak pulse power level much greater than the CW power setting. For example, for a pulse duration of 0.001 seconds and N=1 pulse train (one pulse every 0.25 seconds), the maximum allowed peak power would be almost 4 mW with a consequential average power of approximately 0.016 mW.

Laser safety standards require that adequate safeguards be designed into the laser drive circuitry to ensure that safe power settings are not exceeded. This is usually implemented in commercial CW laser projectors using a potentiometer which is adjusted to the proper resistance setting resulting in a value less than 1 mW output power into the specified aperture. In the case of pulsed laser projectors, the output power is normally set at a fixed level corresponding to the maximum peak power level at a particular pulse duration at a fixed pulse clock frequency. Analog circuitry is used to monitor the pulse signal to ensure that the pulse parameters are maintained within safe limits.

For applications such as the imaging of reflected structured laser light pulsing of the laser projector has been used to improve "stop-action" imaging of moving targets of interest. Stop-action or strobing of the target by the laser projector is used to avoid blurring resulting from the relative motion during the imager integration period. The application of strobing over short durations also results in very low relative signal levels due to the short camera exposure intervals of the imager. This problem is exaggerated if the targets of interest have very low optical reflectance properties thus giving extremely low signal levels acquired by the imager during the exposure time.

The present invention provides a method and system for incorporating into a laser driver circuit a technique to automatically maximize the operating parameters of a laser diode within the constraints of a predetermined standard. The laser diode operating characteristic is based on the laser diode gain which is determined during calibration of each laser diode projector as well as application of the specified laser safety formulas.

The present laser control system provides a system and method for controlling the operating parameters of a laser diode. The preferred embodiment of the laser control circuit includes a laser diode that is powered by a laser drive current. The laser diode has a laser output having a peak power level. A detector is coupled to the laser diode for sensing the laser output. A laser driver including a primary control loop is operable, in response to the sensed laser output and a reference, to control the laser drive current such that the output characteristic corresponds to the reference. A controller is coupled to the driver. The controller includes a laser settings module for generating the reference in response to a laser output setting such that the laser output characteristic is maintained at approximately a predetermined output level. The output level of the laser diode is maintained within a predetermined safety standard. Another aspect of the invention provides an independent safety monitoring function based on the laser settings.

For a more complete understanding of the invention, its objects and advantages, reference may be had to the following specification and to the accompanying drawings.

DETAILED DESCRIPTION OF THE PREFERRED EMBODIMENT

Figure 1:
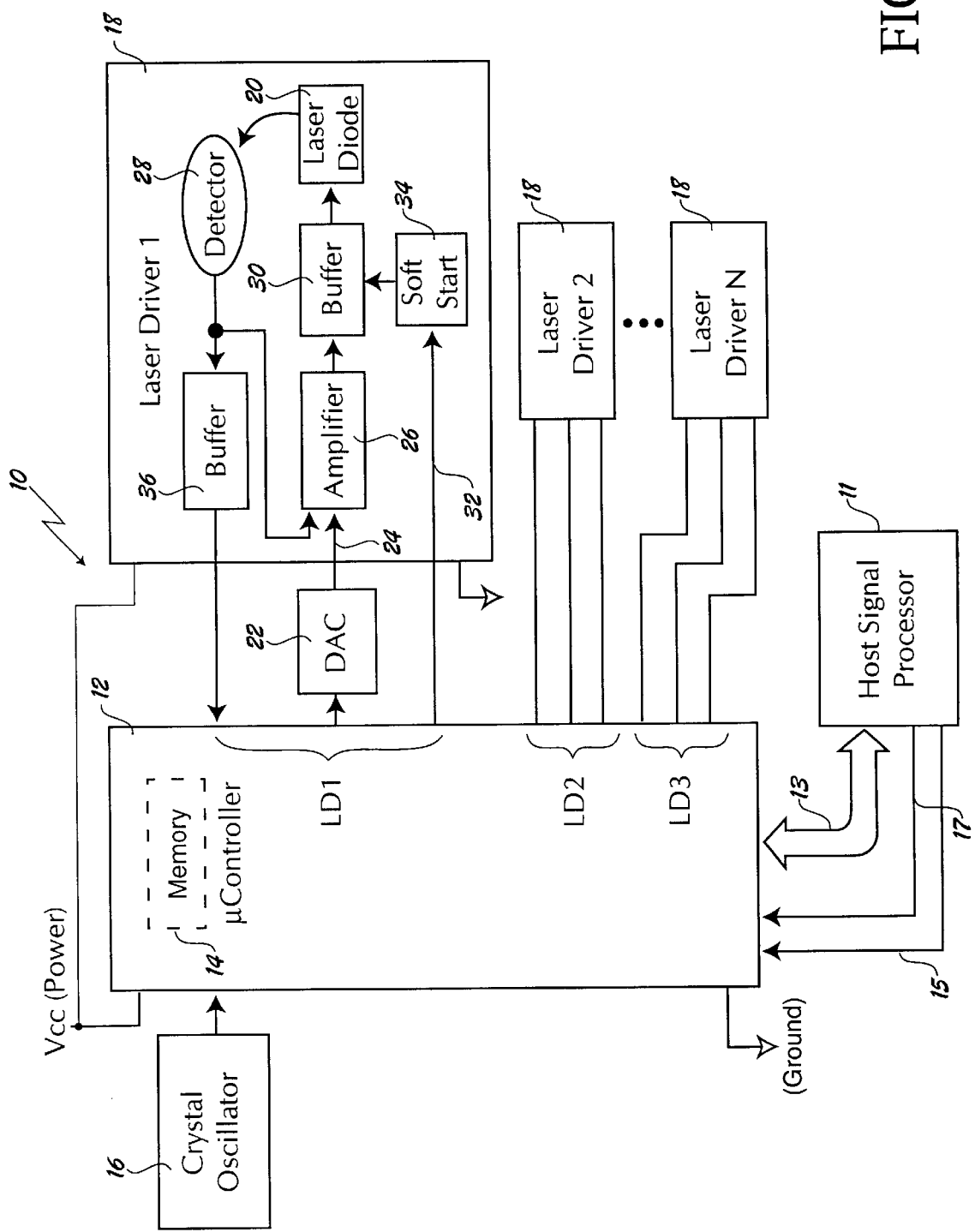
FIG. 1 illustrates a block diagram of a laser control system in accordance with the teachings of the invention.

Referring to FIG. 1, a laser control system 10 according to the present invention is shown. While the present invention is shown and described as being separated into multiple assemblies, it will be appreciated that the particular division of functions is merely exemplary, and the laser control system 10 could be mounted on a single assembly or multiple assemblies. The laser control system 10 provides a method for maximizing the operational characteristics of a laser diode while ensuring compliance with governing standards such as safety standards and customer imposed standards. A host sensor microprocessor 11 such as a Motorola ColdFire communicates to the laser control system 10 through a serial link 13, a RESET signal 15, and a CNTRL signal 17 during several operating modes such as calibration, operating mode selection, and initial system set up.

The laser control system 10 includes a microcontroller 12 for executing a program stored in system memory 14. In the presently preferred embodiment of the invention, a Motorola microcontroller is employed as the microcontroller 12. The Motorola microcontroller includes an on-board 8 bit analog to digital converter (ADC), an 2k EEPROM for system memory 14, and a serial interface 13. One skilled in the art will readily recognize that other microcontrollers, ADCs, and quantities and types of system memory 14 can be utilized. A crystal oscillator 16 coupled to the microcontroller 12 provides an accurate, stable clock reference. In the presently preferred embodiment, two laser drivers 18 are coupled to the microcontroller 12 via power, ground, and three control lines. However, the scope of the invention includes powering one or more laser drivers 18 as illustrated in FIG. 1. Each laser driver 18 provides a gain stage for powering a laser diode 20. A digital to analog converter (DAC) 22, converts a digital signal from the microcontroller 12 to an analog reference voltage for driving the laser driver 18. The reference signal 24 is coupled to the noninverting input of an amplifier 26 used within a primary control loop for regulating the output of the laser diode 20. The inverting input of the amplifier 26 is coupled to the output of an internal photodetector detector 28 that senses the optical output of the laser diode 20. A capacitor (not shown) is connected from the amplifier output to the inverting input to provide stabilizing feedback. Those skilled in the art will readily recognize that numerous other feedback circuits may be employed to stabilize the amplifier 26. The output of the amplifier 26 is coupled to a buffer 30 that is controlled by an ENABLE signal 32 through a softstart circuit 34. The softstart circuit 34 disables the laser diode 20 until stable circuit power level has been reached and a no fault condition exists The first buffer 30 provides a sufficient laser driver current and as well provides an independent path for disabling power to the laser diode 20 as in the above referenced examples. A second buffer 36 is coupled to the output of the internal photodetector 28 to provide a buffered representation of the laser diode output to the microcontroller 12.

Figure 2:
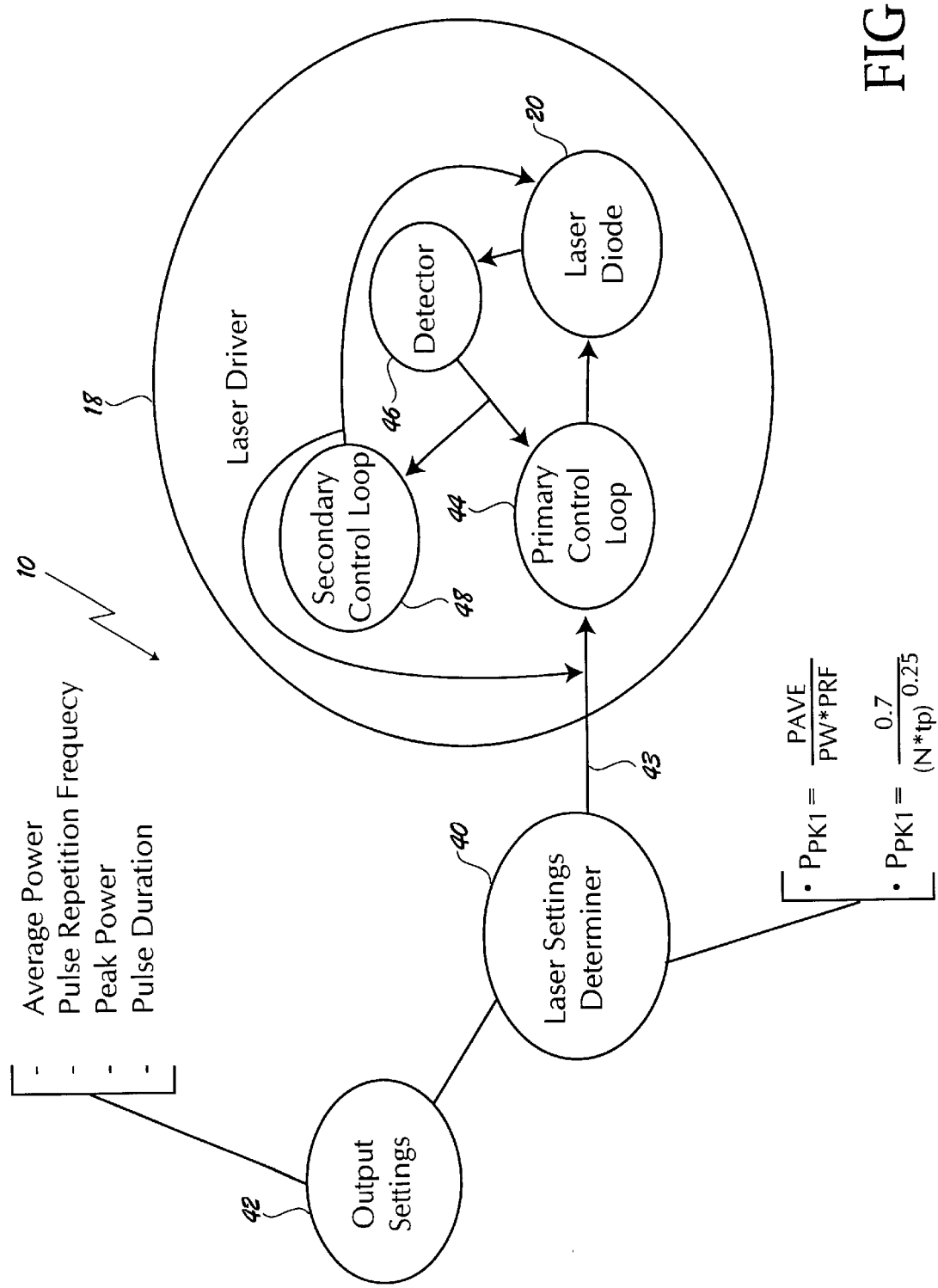
FIG. 2 illustrates an entity relationship diagram of a laser control system in accordance with the teachings of the invention.

Referring to FIG. 2, a functional block diagram of the laser control system 10 is illustrated. The laser control system 10 includes a laser settings module 40 for determining the operational characteristics of the laser diode 20 from predetermined output settings 42. The laser diode operational characteristics are selected by the laser settings module 40 so that the peak power of the laser diode 20 is maximized while remaining within a predetermined safety standard limiting output characteristics such as average power or pulse energy. Examples of such safety standards include customer defined safety standards, U.S. safety standards, and the international safety standard for Class 3A rated laser systems, EN 60825-1. For example, a user may select a pulse duration and the number of pulses per interval to be applied to the laser diode 20; in response the laser settings module 40 determines the maximum peak power the laser diode 20 may be set to while still complying with the safety standard. By maximizing the peak power emitted by the laser diode 20, measurement errors associated with detecting low levels of reflected light are minimized. Likewise, one of the other output settings such as the pulse duration may be the determined variable, while the peak power and number of pulses are initially selected. In each case, the laser settings module 40 selects a value for the determined variable that optimizes the laser diode output while complying with the predetermined safety standard, represented for example, by the formula presented earlier, thereby reducing measurement errors. To control the value of the laser diode peak power, PRF, and pulse duration, the laser settings module 40 sets the value of a reference (REF) 43 that is coupled to a primary control loop 44 of the laser driver 18.

The primary control loop 44 ensures the laser output tracks the corresponding reference level by controlling the quantity of current flowing to the laser diode 20. The detector 46 provides a feedback signal to the primary control loop 44 indicating the intensity of the laser diode output. The primary control loop 44 compares the actual intensity of the laser output to the reference level supplied by the laser settings module 40 and adjusts the laser drive current in response.

The sensed laser output of the detector 46 is additionally coupled to an input of a secondary control loop 48 that provides redundant control of the laser output. The secondary control loop 48 disables the laser diode output in response to conditions such as detecting a fault.

Figure 3:
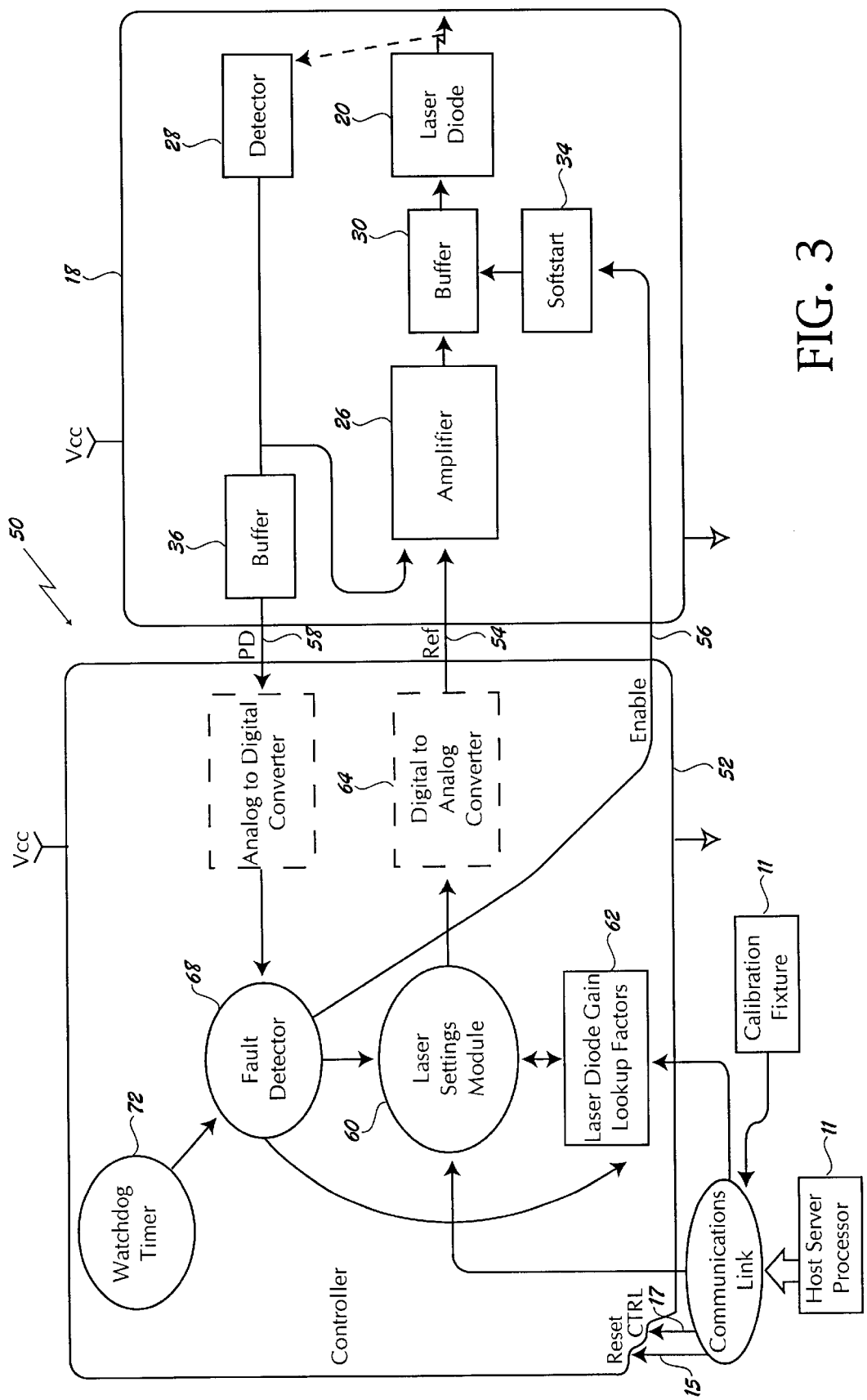
FIG. 3 illustrates a block diagram of a presently preferred embodiment of a laser control system in accordance with the teachings of the invention.

Referring to FIG. 3, a block diagram of a presently preferred embodiment of a laser control system 50 in accordance with the principles of the invention is illustrated. The laser control system 50 includes a laser driver 18 that is similar to previously described embodiments. The laser driver is coupled to a controller 52 through a set of control and power lines. The controller 52 of the presently preferred embodiment includes the functional features of the previous embodiments with additional calibration and fault detection capabilities.

The control lines include a reference (REF) 54, an ENABLE 56, and a sensed laser output signal (PD) 58. The reference 54 is a voltage signal that sets the laser diode operating level. The ENABLE 56 is a redundant signal path to control the application of power to the laser diode 20 to ensure the laser diode 20 can be disabled if a failure occurs within the laser control system 50. The sensed laser output signal 58 is used for fault detection to determine whether the laser diode operating parameters are within the predetermined safety standard as well as within predicted operating limits over changing environmental conditions such as temperature and duration of use.

The controller 52 includes a laser settings module 60 for setting the operating parameters of the laser diode 20. The laser settings module 60 implements a peak power formula for the pertinent laser safety standard. In the presently preferred embodiment, the peak power formula includes three variables; pulse duration, pulse repetition frequency (PRF), and peak power. PRF is related to N, the number of pulses in 0.25 seconds, by the relation PRF=4N. In response to selection of two of the three variables such as pulse duration and PRF, the laser settings module 60 determines the remaining variable which in this case is the maximum peak power for the laser output. The laser settings module 60 queries a Laser Gain Lookup Factors Table 62 to set an output signal to a level corresponding to the determined peak power. In the presently preferred embodiment, the laser settings module 60 computes the peak power using a safety formula like that presented earlier with the pulse duration and PRF as inputs. However, it is within the scope of the invention to employ a look up table for determining the peak power or a parameterized representation of the safety formula or to use other operating parameters such as pulses per interval. It is additionally within the scope of the invention to specify the peak power and control either the pulse duration or PRF. A DAC 64 converts the output signal to an analog level that is coupled through the reference 54 to the laser driver 18.

Figures 4, 5:
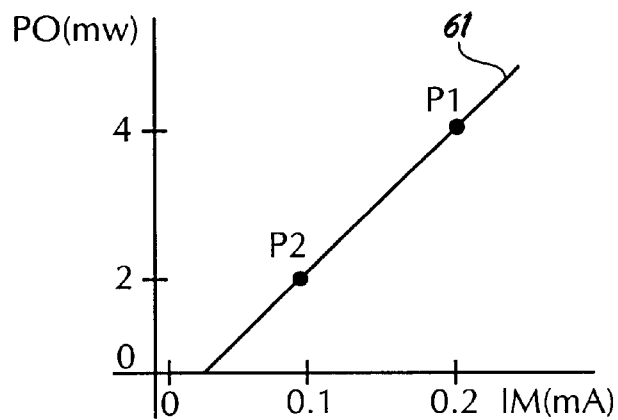
FIG. 4 illustrates a graphical representation of the relationship 5 between laser output and detector current.
FIG. 5 illustrates a Laser Gain Lookup Factors Table.

A calibration fixture 66 determines the gain characteristics of the laser diode 20 during the laser driver manufacturing process. In the presently preferred embodiment, the calibration fixture 66 comprises a personal computer, a separate laser power meter, and a communications link to the laser controller. However, the scope of the invention includes locating portions of the calibration fixture elsewhere such as within the sensor host processor. The gain characteristics are represented by a gain curve 61 that describes the gain characteristic of the laser diode 20 from minimum to maximum power levels (see FIG. 4). Two or more power measurements are made at low, nominal and high power settings to characterize the gain curve. In the presently preferred embodiment, the relationship between the output power and the feedback monitoring current is described by a linear approximation, however the scope of the invention includes using other curve fitting techniques to represent the gain curve 61. The linear approximation is described by a set of parameters that are stored, via the communications link, in a Laser Gain Lookup Factors Table 62 (see FIG. 5).

The Laser Gain Lookup Factors Table 62 contains device characteristic information associated with each laser diode 20 such as points describing the gain curve at nominal and half-nominal output power settings. In addition, the Laser Gain Lookup Factors Table 62 includes scaling factors associated with each laser diode 20 that account for changes in the current-gain curve over temperature and time, and tolerances of the instruments used to perform the calibration.

Referring to FIG. 3, a fault detection scheme is illustrated. The fault detection scheme ensures that the peak power of the laser output does not exceed a predetermined limit if a single point failure occurs within the laser control system 50. The fault detection scheme includes a fault detector 68 for detection and response to faults, a watchdog timer 72, and redundant control paths for disabling the laser diode 20.

The fault detector 68 monitors the pulse parameters in a failsafe mode to insure that the predetermined safety standards are not exceeded. Pulse parameters such as the pulse duration, power output, and PRF are monitored to ensure the laser control system 50 does not improperly or by external effects violate laser safety levels due to a single failure. In the event that a requested pulse parameter exceeds a safe threshold, the fault detector 68 overrides the request from the control link and interrupts current flowing to the laser diode 20, thereby disabling the laser output. The controller 52 preferably communicates an error message to the host sensor identifying the nature of the failure. To reactivate the laser diode 20, the host sensor processor 11 communicates with the microcontroller 12 via the serial link 13.

The fault detector 68 additionally monitors the watchdog timer 72 and other elements of the controller 52 to ensure the laser control system 50 is in an active operating state. The watchdog timer 72 monitors execution of the system program. The watchdog timer 72 activates if the system program has stopped executing. In response to the watchdog timer 72 becoming active, the fault detector 68 disables the laser diode 20 via the ENABLE signal.

Referring to Table I, the response of the laser control system 50 to several failure modes is described.

TABLE I

| DESCRIPTION OF FAILURE | SYSTEM RESPONSE TO THE FAILURE | SYSTEM STATUS AFTER RESPONSE |
| --- | --- | --- |
| RESET signal grounded | Controller upon reset sets output ENABLE to low state | Laser is disabled after internal time delay not to exceed 16 ms |
| Crystal oscillator disabled | Internal Controller hardware timer is initiated upon removal of master clock At timeout, ENABLE transitions from high to the low state | Laser is disabled after internal time delay not to exceed 16 ms |
| Reference (REF) disabled | Controller senses out of tolerance measurement from detector and disables the laser by setting ENABLE to low state | Laser is disabled after internal time delay not to exceed 16 ms |
| Main program stops executing | Internal Controller watch dog timer times out when the main program execution is halted and ENABLE transitions from high to low state. Under normal conditions, timer is reset during main program execution continuously | Laser is disabled after internal time delay not to exceed 16 ms |

TABLE I-continued

| DESCRIPTION OF FAILURE | SYSTEM RESPONSE TO THE FAILURE | SYSTEM STATUS AFTER RESPONSE |
| --- | --- | --- |
| 1. When in CW mode, any pulse parameters sent to laser controller while /CTRL is enabled<br>2. When in PULSE mode, any incorrect parameters sent to laser controller while /CTRL is strobing | 1. Controller identifies a change to laser operating mode without the appropriate change to the control line /CTRL. The laser is disabled by setting ENABLE to a low state and Reference (REF) to 0 VDC<br>2. Controller identifies an incorrect configuration for the PULSE mode and disables the laser by setting ENABLE to the low state and Reference to 0 VDC | 1. Laser is disabled upon receipt of new commands<br>2. Laser is disabled after 5 pulses are sampled on /CTRL |
| GROUND to controller board and driver floating | Removal of circuit ground return | Laser is disabled immediately upon removal of ground |
| $V_{CC}$ (power) for both controller and driver is an open | Removal of circuit power | Laser is disabled upon removal of power immediately |
| $V_{CC}$ (power) for just the driver is an open | Removal of circuit power | Laser is disabled upon removal of power immediately |
| GROUND to just the driver floating | Removal of circuit ground return | Laser is disabled immediately upon removal of ground |
| Open detector connection from driver to controller | Controller senses loss of feedback signal and disables the laser through ENABLE and Reference | Laser stays at constant power and is disabled after internal time delay not to exceed 16 ms |
| REF saturated at maximum voltage output of 5 VDC | Controller senses out of tolerance increase in laser power by reading detector and disables laser through ENABLE and Reference if it can't reach acceptable levels | Laser power increases to the full power of the laser and then within a millisecond turns off laser diode |
| ENABLE signal grounded | Soft start circuit requires 5VDC on ENABLE to activate the laser | Laser is disabled immediately |
| Detector feedback in primary control loop is an open | Controller senses out of tolerance increase in laser power by reading detector and disables laser through ENABLE and Reference if it can't reach acceptable level | Laser power increases to the full power of the laser and then within a millisecond turns off laser |
| Detector feedback in primary control loop shorted to ground | Controller senses out of tolerance decrease in laser power by reading detector and disables laser through ENABLE and Reference if it can't reach acceptable level | Laser power increases to the full power of the laser and then within a millisecond turns off laser diode |
| Feedback on laser drive amplifier stage is an open | Controller senses out of tolerance increase in laser power by reading detector and disables laser through ENABLE and Reference if it can't reach acceptable level | Laser power increases to the full power of the laser and then within a millisecond turns off laser diode |
| Laser drive amplifier output is shorted | Controller senses out of tolerance increase in laser power by reading detector and then disables laser through ENABLE and Reference if it can't reach acceptable level | Laser power increases to the full power of the laser and then within a millisecond turns off laser diode |

The laser settings module 60 may additionally modify the value of the reference 54 to ensure that system delays in responding to a fault do not cause the laser output to exceed the predetermined safety standard. For example, when the pulse width selected by the laser settings module 60 is less than the fault response time of the laser control system 50, the determined value peak power could lead to an excessive laser output. In the presently preferred embodiment, the maximum fault response time is 16 msec as shown in Table I. Therefore, the maximum peak power is limited to a value that in combination with a 16 msec pulse width and the selected PRF, does not exceed the predetermined safety standard. Those skilled in the art will readily recognize that the fault response time may change depending on oscillator frequency, control chip selection, and future improvements in technology.

Figure 6:
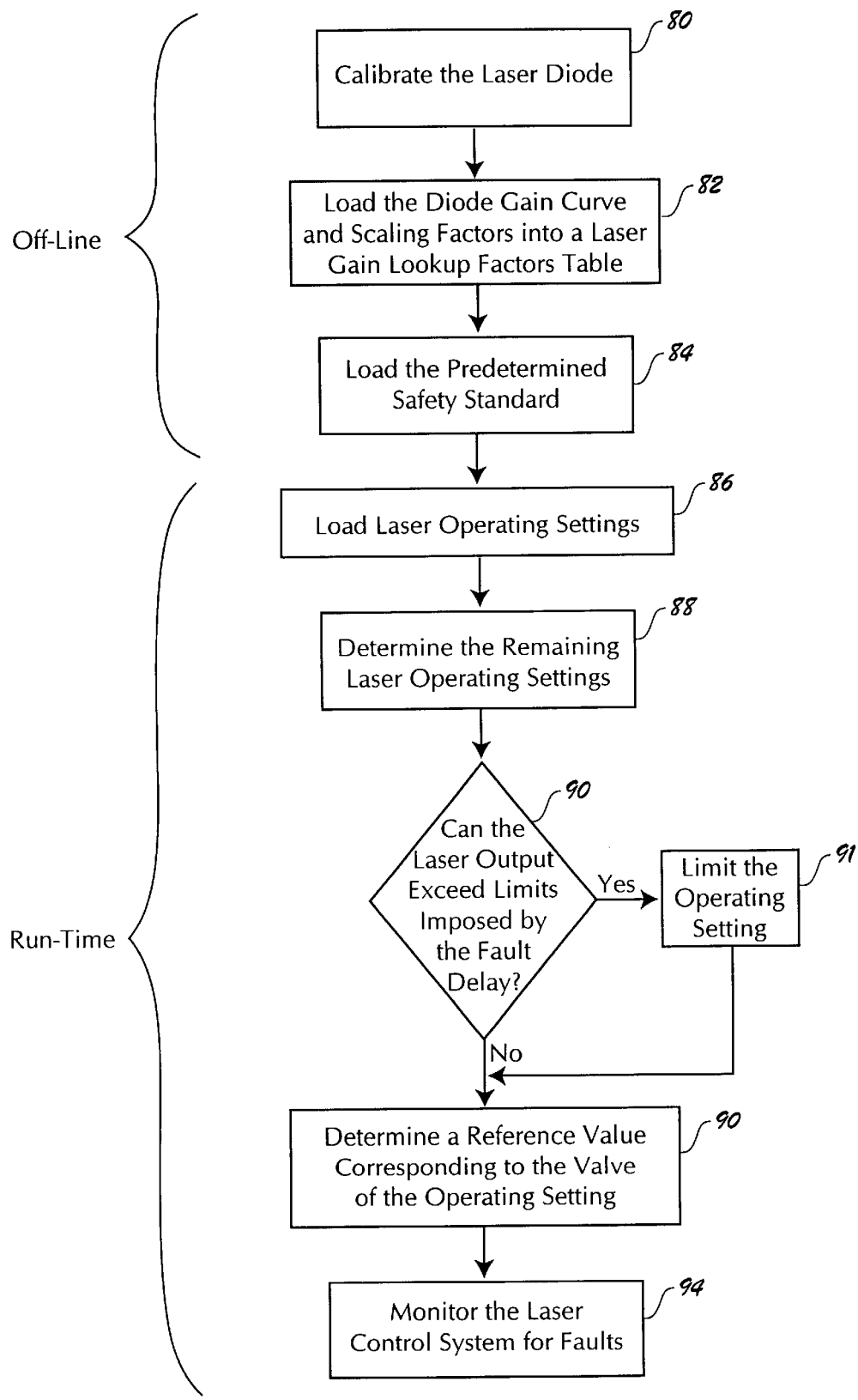
FIG. 6 is a flow diagram illustrating calibration and operational modes of a laser control system in accordance with the teachings of the invention.

Referring additionally to FIG. 6, the operational control algorithm of the laser control system 50 is illustrated. The operating mode of the laser control system 50 is set through the communication link and the laser diode 20 is activated upon receiving the CTRL input. The controller 52 then automatically modifies the laser power setting consistent with the loaded laser safety standard. The operating mode is preferably limited to being changed only using the communication link. The host processor communicates the desired diode operating parameters, such as PRF and the pulse duration, to the controller 50. Based on the communicated values, the controller 50 determines the remaining diode operating parameters, such as the peak power level, and sets the laser driver 18 to the new power level upon receiving the CTRL active signal from the sensor host controller. The controller 50 also records the values of PRF, pulse duration, and power level for the particular pulse mode and then monitors the laser diode 20 in real-time for laser safety At step 80, the laser diode gain characteristics are calibrated; preferably with an external power meter, personal computer and communications link to the controller. Two or more power measurements are made at low, mid and high power settings. The resolution of the power setting adjustments is equal to the resolution of the DAC scaled to cover the full range of operating optical power. A relationship between the diode optical output power and the feedback monitoring current is determined and at step 82, a corresponding diode gain curve representation is stored into the Laser Gain Lookup Factors Table 62 via the communications link 13 during manufacturing. Other device characteristic information such as scaling factors are additionally entered into the Laser Gain Lookup Factors Table 62.

At step 84, the predetermined safety standard representation is downloaded into the laser control system non-volatile memory as the laser settings module 60. Although in the presently preferred embodiment, the laser settings module 60 is downloaded into the laser control system, it is within the scope of the invention to maintain selectable laser setting modules for each safety standard.

The laser settings module 60 accesses the output settings module 70 to load the laser diode output settings corresponding to the operating mode of the laser control system 50, at step 86. An output setting value, in this example a peak power setting, for the laser diode 20 is computed based on the predetermined safety standard, at step 88. The output setting value is modified if necessary to ensure the laser output does not exceed the predetermined safety standard under fault conditions, at step 90. The device characteristic information is retrieved from the Laser Gain Lookup Factors Table 62. The computed output setting value is modified as necessary and converted to a reference value corresponding to the diode characteristics and scaling factors stored in the Laser Gain Lookup Factors Table 62. The reference value is converted to an analog signal and coupled to the laser driver amplifier 26 which generates an output in response to comparing the reference to a laser output sense signal. The amplifier output is converted to a laser drive current by buffer 30. During initial turn-on of the laser control system 50, the laser drive current is ramped up in response to a positive value of the REF voltage as long as the ENABLE signal 32 is provided through the softstart circuit 34. During normal operation, the softstart circuit 34 does not affect the laser drive current. The laser drive current flows through the laser diode 20 powering the laser output. A detector 28 senses the laser output and generates the laser output sense signal. The laser output sense signal is coupled to the controller 52 through a buffer 36.

At step 94, the fault detection scheme monitors the laser output and the components of the laser control system 50 to ensure the laser output does not exceed the predetermined safety standard should a fault occur.

The laser control system and method of the present invention controls the operational characteristics of a laser diode employed in an imaging system. The laser control system optimizes the laser output of a laser diode over selectable operating modes while ensuring the laser output remains within the limits of a predetermined safety standard. Additionally, the system accounts for changes in system operating characteristics. Also, the laser output is constrained from exceeding the predetermined safety standard during single point failures.

Further, while the preferred embodiment of the laser control system employs a microcontroller as part of the laser driver assembly, the functions performed by the microcontroller could be equivalently performed by a programmable logic device (produced, for example, by Lattice, Inc.), a timer, discrete ADC and DACs, a serial interface chip, and a non-volatile storage resource such as flash memory or an EEPROM.

Additionally, while the preferred embodiment of the laser control system employs a microcontroller as part of the laser driver assembly, the functions performed by the microcontroller could be equivalently performed by the sensor host processor with additional resources such as ADCs and DACs.

A further embodiment of the laser control system employs a digital potentiometer, produced, for example, by Dallas Semiconductor, to replace the DAC, EEPROM and serial interface chip.

Thus it will be appreciated from the above that as a result of the present invention, a laser control system for a laser imaging system is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A pulsed laser control system comprising:
    a laser diode powered by a laser drive current for generating a laser output having a pulsed operating characteristic;
    a detector coupled to the laser diode for sensing the laser output;

a laser driver, including a primary control loop, responsive to the sensed laser output and a reference signal, controls the laser drive current in accordance with the reference signal; and a controller, comprising a selectable laser output setting device, the controller, responsive to a selectable laser output setting, determines appropriate pulse values that establish an allowable laser pulse operating characteristic in accordance with a predetermined safety standard and generates the reference signal in accordance with the determined pulse values.

2. The pulsed laser control system of claim 1 wherein the selectable laser output setting is selected from the group of pulse width and pulse repetition frequency; and wherein the determined laser pulsed operating characteristic is peak pulse power.

3. The pulsed laser control system of claim 1 wherein the selectable laser output setting is selected from the group of peak pulse power and pulse repetition frequency; and wherein the determined laser pulsed operating characteristic is pulse width.

4. The laser control system of claim 1 further comprising a fault detection scheme responsive to a fault limits the laser output to within the predetermined safety standard.

5. The laser control system of claim 1 wherein the primary control loop includes an amplifier having a non-inverting input coupled to the reference and an inverting input coupled to the sensed laser output.

6. The laser control system of claim 4 wherein the detector is a photodiode.

7. The laser control system of claim 1 wherein the output characteristic is selected from the group of: pulse energy and average power.

8. The laser control system of claim 4 wherein the fault detection scheme further comprises:

a buffer coupled between the amplifier and the laser diode, the buffer responsive to an enable signal allows the flow of laser drive current to the laser diode; and a fault detector responsive to detecting a fault disables the enable signal.

9. The laser control system of claim 1 further including a softstart circuit coupled to the laser diode to disable the laser diode until stable circuit power level has been reached and a no fault condition exists.

10. The laser control system of claim 1 wherein the controller further includes a laser diode gain lookup factors table for storing a gain characteristic of the laser diode.

11. A pulsed laser control system comprising:

a laser diode powered by a laser drive current for generating a laser output having a peak power level;

a detector coupled to the laser diode for sensing the laser output;

a laser driver, including a primary control loop, being responsive to the sensed laser output and a reference signal controls the laser drive current in accordance with the reference signal;

an input element configured to accept a selectable laser output setting; and a controller, responsive to the selectable laser output setting, determines appropriate pulse values that establish an allowable laser pulse operating characteristic in accordance with a predetermined safety standard and generates the reference signal in accordance with the determined pulse values.

12. The laser control system of claim 11 wherein the laser output setting is characterized by at least two of peak power setting, pulses per interval setting, and pulse duration setting.

13. The laser control system of claim 12 further comprising a laser diode gain lookup factors table.

14. The laser control system of claim 13 further including a buffer in the primary control loop for interrupting the laser drive current such that the laser output is disabled; and a fault detector, responsive to detecting a fault sends, a disable signal to the softstart circuit, whereby the laser drive current is interrupted.

15. The laser control system of claim 14 wherein the controller limits the reference to a level wherein the peak power of the laser output remains within the predetermined safety standard after a fault.

16. The laser control system of claim 15 wherein the detector is a photodiode.

17. A method of controlling a laser imaging system, comprising the steps of:

providing a laser diode;

powering the laser diode with a laser drive current, such that a laser output having a laser operating characteristic is generated;

comparing a representation of the laser output to a reference;

regulating the laser drive current in accordance with the reference;

providing a selectable laser output setting;

in response to the selectable laser output setting, automatically determining appropriate pulse values establishing allowable laser operating characteristics based upon a predetermined safety standard limiting an output characteristic; and generating the reference at a determined value to achieve an allowable laser output.

18. The method of claim 17 further including the steps of:

monitoring the laser control system to determine whether a fault has occurred; and in response to detecting the fault, interrupting the laser drive current such that the laser output is disabled.

19. The method of claim 18 further including the steps of:

asserting an ENABLE signal that enables the laser drive current to flow to the laser diode; and in response to detecting the fault, disabling the ENABLE signal such that the flow of the laser drive current to the laser diode is interrupted.

20. A laser control system comprising:

a laser diode powered by a laser drive current for generating a laser output having an operating characteristic;

a detector coupled to the laser diode for sensing the laser output;

a laser driver, including a primary control loop, responsive to the sensed laser output and a reference signal, controls the laser drive current in accordance with the reference signal;

a fault scheme, responsive to detecting a single fault limits the operating characteristic of the laser diode such that the laser output does not exceed a limit based upon a predetermined safety standard;

a controller, having a selectable laser output setting device, the controller responsive to a selectable laser output setting, determines appropriate values establishing allowable laser operating characteristics based upon a predetermined safety standard limiting an output characteristic, and produces said reference signal at a determined value to achieve said allowable laser output.

21. The laser control system of claim 20 wherein the fault scheme further comprises a fault detector for detecting and responding to faults.

22. The laser control system of claim 20 wherein the fault scheme provides an enable signal having an enable state and a disable state, and controls the laser drive current such that the enable state allows the laser drive current to flow through the laser diode and the disable state disables the flow of the laser drive current.

23. The laser control system of claim 21 wherein the fault detector limits the determined value of the reference signal such that the output characteristic of the laser output remains within the predetermined safety standard after a fault.

24. The laser control system of claim 21 wherein the controller further includes a watchdog timer coupled to the fault detector for monitoring activity of the laser control system, wherein the watchdog timer activates in response to a predetermined time period of laser control system inactivity.

* * * * *

UNITED STATES PATENT AND TRADEMARK OFFICE
CERTIFICATE OF CORRECTION

PATENT NO.   : 6,661,820 B1
DATED        : December 9, 2003
INVENTOR(S)  : Joseph Camilleri et al.

It is certified that error appears in the above-identified patent and that said Letters Patent is hereby corrected as shown below:

Column 12,
Line 6, "sends," should be -- sends --.

Signed and Sealed this

Twelfth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,661,820 B1
DATED : December 9, 2003
INVENTOR(S) : Joseph Camilleri et al.

It is certified that error appears in the above-identified patent and that said Letters Patent is hereby corrected as shown below:

Column 11,
Line 30, "the group of:" should be -- a group of --.

Column 12,
Line 26, "providing" should be -- selecting --.
Line 27, before "in response" insert -- determining, --.
Lines 27-37, "automatically determining appropriate pulse values establishing allowable laser operating characteristics based upon a predetermined safety standard limiting an output characteristic" should be -- appropriate pulse values that establish an allowable laser pulse operating characteristic in accordance with a predetermined safety standard --.
Lines 32-33, "at a determined value to achieve an allowable laser output" should be -- in accordance with the predetermined pulse values --.

Signed and Sealed this

Sixteenth Day of August, 2005

JON W. DUDAS
*Director of the United States Patent and Trademark Office*